(12) United States Patent
Marino et al.

(10) Patent No.: US 9,502,312 B2
(45) Date of Patent: Nov. 22, 2016

(54) AREA EFFICIENT FIELD EFFECT DEVICE

(71) Applicant: ETA Semiconductor Inc., San Jose, CA (US)

(72) Inventors: Fabio Alessio Marino, Poway, CA (US); Paolo Menegoli, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 14/140,337

(22) Filed: Dec. 24, 2013

(65) Prior Publication Data

US 2015/0179732 A1    Jun. 25, 2015

Related U.S. Application Data

(63) Continuation of application No. 12/927,853, filed on Nov. 29, 2010, now abandoned.

(51) Int. Cl.

| | |
|---|---|
| *H01L 29/66* | (2006.01) |
| *H01L 21/84* | (2006.01) |
| *H01L 29/10* | (2006.01) |
| *H01L 29/423* | (2006.01) |
| *H01L 29/778* | (2006.01) |
| *H01L 29/80* | (2006.01) |
| *H01L 27/12* | (2006.01) |
| *H01L 29/786* | (2006.01) |
| *H01L 29/04* | (2006.01) |
| *H01L 29/06* | (2006.01) |

(52) U.S. Cl.
CPC ........... *H01L 21/84* (2013.01); *H01L 27/1203* (2013.01); *H01L 29/1029* (2013.01); *H01L 29/1033* (2013.01); *H01L 29/1037* (2013.01); *H01L 29/42316* (2013.01); *H01L 29/42384* (2013.01); *H01L 29/7786* (2013.01); *H01L 29/7789* (2013.01); *H01L 29/78696* (2013.01); *H01L 29/802* (2013.01); *H01L 29/045* (2013.01); *H01L 29/0657* (2013.01)

(58) Field of Classification Search
CPC ........... H01L 29/1029; H01L 29/1033; H01L 29/1037
USPC ........ 257/192, 194, 287, 327, 330, E29.052, 257/E29.246
See application file for complete search history.

(56) References Cited

U.S. PATENT DOCUMENTS

| | | | |
|---|---|---|---|
| 5,497,019 A | 3/1996 | Mayer et al. | |
| 5,530,272 A * | 6/1996 | Kudo et al. | ..................... 257/192 |
| 6,242,304 B1 | 6/2001 | Geusic et al. | |

(Continued)

OTHER PUBLICATIONS

International Search Report and Written Opinion—PCT/US20121037084—ISAEPO—Dec. 20, 2012.

*Primary Examiner* — Robert Huber

(57) ABSTRACT

A novel semiconductor transistor is presented. The semiconductor structure has a gate region forming a channel with repetitive patterns in the direction perpendicular to the current flow, so that the portion of its channel that is not strictly planar contributes to a significant reduction of the silicon area occupied by the device. It offers the advantage of lower on-resistance for the same silicon area while improving on its dynamic performances. The additional cost to shape the channel region of the device in periodic repetitive patterns is minimum, which makes the present invention easy to implement in any conventional CMOS process technology and very cost effective.

15 Claims, 17 Drawing Sheets

(56) References Cited

U.S. PATENT DOCUMENTS

| | | | |
|---|---|---|---|
| 6,355,532 B1 * | 3/2002 | Seliskar | B82Y 10/00 257/E21.404 |
| 6,413,802 B1 | 7/2002 | Hu et al. | |
| 6,815,772 B2 | 11/2004 | Takemura | |
| 7,170,118 B2 * | 1/2007 | Yang | 257/286 |
| 7,435,628 B1 | 10/2008 | Hopper et al. | |
| 2005/0230746 A1 * | 10/2005 | Eden | H01L 23/4824 257/330 |
| 2006/0255412 A1 * | 11/2006 | Ramaswamy et al. | 257/368 |
| 2008/0203430 A1 | 8/2008 | Simin et al. | |
| 2012/0132958 A1 | 5/2012 | Marino et al. | |

* cited by examiner

AREA EFFICIENT FIELD EFFECT DEVICE

RELATED APPLICATION DATA

The present application is a continuation patent application and claims priority from the regular patent application U.S. Ser. No. 12/927,853 entitled "High performance Transistor", filed on Nov. 29, 2010 under 37 CFR 1.53(b).

BACKGROUND OF THE INVENTION

1. Field of the Invention

The present invention is in the field of semiconductor structures. The present invention is further in the field of semiconductor structures of transistor devices. The present invention further relates to the field of integrated power devices and circuits. The implementation is not limited to a specific technology, and applies to either the invention as an individual component or to inclusion of the present invention within larger systems which may be combined into larger integrated circuits.

2. Brief Description of Related Art

The semiconductor transistor is the most important component for large integrated circuits. The complementary CMOS components used in current integrated circuit process technologies have undergone a continuous shrinking of the silicon area needed for elementary components, however the need to further improve on its general performance while reducing its cost is still a necessity that poses a significant challenge.

In particular, in the area of power integrated circuits the silicon area occupied by the power transistors and their performance is more and more important in several applications. A very critical parameter for power transistors in integrated circuits is their specific $R_{DSon}$, measured in $\Omega*mm^2$. The silicon area is directly proportional to the cost of the integrated circuit and a low on-resistance is always desirable to increase the efficiency of the circuit and to reduce the power dissipation and therefore the temperature of the chip.

Typically the power transistors utilized in modern integrated circuits are constituted by large arrays of MOSFET and DMOS devices effectively connected in parallel. Generally these transistors are used in applications that require high currents. The efficiency of a device employing power transistors is increased by minimizing the power losses in the system. In particular for switching power converters the optimization of the process technology and of the semiconductor structures to match the electrical characteristics of the system is paramount to achieve high efficiency.

The most important Figure Of Merit (FOM) of a power transistor in specific power applications is the $R_{DSon}*Q$ of the transistor where $R_{DSon}$ is the on-resistance while Q is the charge associated with the gate capacitance (C*V). This FOM is directly associated with the time constant of the device. The lower the $R_{DSon}$ and the gate charge, the higher the achievable efficiency. In conventional CMOS technology, this FOM is independent from the silicon area since a lower $R_{DSon}$ deriving by an increase of the device size is generally correlated with an increase of the gate capacitance by the same amount.

On the other hand the cost in terms of occupied silicon area is a very important parameter and any method or technology to reduce the cost of the power device maintaining the same FOM (therefore increasing the current density per area) is very desirable. One means for increasing the current density is to increase the overall channel area of a transistor.

Generally the most studied prior art of semiconductor transistors that attempts to increase the equivalent gate area comprises MOSFET with single, double, triple and all-around gate or High Electron Mobility Transistors including III-V materials. The resistance offered by these devices when turned-on and their parasitic capacitances are very important to establish the device efficiency and speed.

Several prior art attempts to improve the control of the carrier transport in the device so as to effectively obtaining low on resistance components have been documented. Some of these examples include Takemura (U.S. Pat. No. 6,815,772), Mayer et al. (U.S. Pat. No. 5,497,019), and Hu et al. (U.S. Pat. No. 6,413,802). The general approach in the cited references is to add more control gate to the device in order to obtain a better Ion/Ioff ratio.

All these examples, however, require a much more complex and costly process involving usually Silicon On Insulator technology, which is still very expensive nowadays. A second problem is the alignment of the different gates of the device. Furthermore, since they are built on buried oxide, they cannot be used for power applications, since their capability to dissipate heat is very poor. Silicon dioxide, for example has a thermal conductivity that is about 100 times smaller than the one for Silicon. Finally, since their main objective is to enhance the control of the carrier transport, they are not very efficient in saving silicon area with respect to the conventional CMOS technology as explained in the following paragraph.

The typical cross-sections of a single and a double gate MOS are illustrated in FIG. 1 and FIG. 2. As it can be seen in a double gate MOS, aside the conventional gate, a second gate is present under the channel in order to improve the control of the channel modulation. In order to achieve the maximum control on the channel, the thickness of the channel region 16 is lower than the maximum extension xd of the depletion region in the channel region 16.

FIG. 3 shows a triple-gate MOS. This device has approximately the same performance of a double gate MOS, but it requires a simpler process technology since the alignment of the different gates is more easily achieved. However, differently from a double gate MOS, the channel width of a triple-gate MOS is limited. The distance between the two lateral gates must be smaller than the maximum extension of the depletion region. This limits the value of the horizontal dimension of the device. Furthermore, for process and cost related reasons, also the vertical dimension of the device is limited.

Another prior art example of enhanced control gate is the approach named "all-around gate MOS". It is shown in FIG. 4. In this case, the gate terminal surrounds the whole channel, leading to an optimum channel control. However, also in this case, several physical and process limitations are present. In order to achieve the best control on the channel transport, the distance between parallel sidewalls of the device channel must be smaller than the maximum extension of the depletion region. This leads to a limit on the maximum extension of the total channel width.

Another interesting prior art attempt to achieve higher density for transistor devices is described in Hopper et al. (U.S. Pat. No. 7,435,628) and is reported in FIG. 5. In this case the gate 23 is in common between two transistors connected in parallel, and built facing each other, one on the left side of the gate and one on the right part of the gate. In this case the device is vertical and its drain 28 is formed under the channel and in the lower part of the structure as shown in FIG. 5. This configuration is therefore mainly used in discrete power devices.

Power semiconductor devices are semiconductor devices used as switches or rectifiers in power electronic circuits (switch mode power supplies for example). They are also called power devices or when used in integrated circuits, they are called power ICs. In the field of integrated power transistors one of the most important parameter is the $R_{DSon}$*area of the utilized technology. The lower the $R_{DSon}$*area, the lower is the cost of the device and the higher the speed of the transistor.

Although the cited prior art references describe structures that are not necessarily planar, they require complex process technologies and are not cost effective in solving the problem of obtaining transistors with lower on resistance per given silicon area in the power IC contest.

It is therefore a purpose of the present invention to describe a novel structure of a semiconductor transistor that offers the advantage of much higher density, reducing silicon area and cost combined with improved performances in terms of on resistance.

SUMMARY OF THE INVENTION

The present invention describes a transistor which has a MOSFET or HEMT structure, with the difference that the channel of the device is not planar but is shaped with periodic patterns in the direction perpendicular to the carrier transport in order to achieve lower specific on-resistance ($R_{DSon}$*area). The channel region has a periodic pattern in the direction perpendicular to the current flow in the transistor itself, such that a characteristic pattern which repeats itself in regular intervals can be identified.

In order to better understand this concept, let us consider the structure illustrated in FIG. 6, which represents one of the embodiments of the present invention in CMOS technology. The gate 33 and the gate-oxide 38 are purposely separated from the substrate 36 in order to better show the channel region 35. As it can be seen, conventional device terminals (source, gate, drain and body) are present. However the channel region under the gate oxide is not flat: a periodic pattern can be identified at the oxide-semiconductor interface where the electronic channel will be formed during the normal operation of the device.

The drain and the source terminals can be shaped in a conventional way as depicted in FIG. 6, or with the same shape of the channel in order to decrease the current density along the contacts.

In FIG. 7 and FIG. 8, different possible shapes for the channel region patterns are depicted. The dimensions and the shape of the channel region determine the saving of silicon area with respect to the more conventional "planar" channel MOS of FIG. 1. In the case of a triangular pattern, such as that one illustrated in FIG. 7, the saving of area is given by the expression:

$$\text{Area saving} = 1 - (\text{Planar Equivalent Area/Total Channel Area}) = 1 - \cos\theta$$

where θ is the angle as indicated in FIG. 7.

It follows that, if for example θ=75 deg, the area saving becomes about 75%. This means that we can build a transistor with the electrical characteristics of W=10 μm using only ¼ of the silicon area, (since its total silicon area is equivalent to the one occupied by a transistor with channel width of 2.5 μm).

FIG. 8 illustrates a more general shape with respect FIG. 7. In this case, the saving of area is given by the expression:

$$\text{Area saving} = 1 - (\text{Planar Equivalent Area/Total Channel Area})$$
$$= 1 - (A + B + 2C\cos\theta)/(A + B + 2C)$$

where A, B and C are the dimensions of a single pattern period as illustrated in the figures, the Planar Equivalent Area is the silicon area occupied and the Total Channel Area is the overall channel area. θ is the angle as indicated in FIG. 8.

If A=B=0, the trapezoidal pattern of FIG. 8 is reduced to the triangular one of FIG. 7. If instead θ=90 deg, we obtain a rectangular pattern.

In the case where the angle θ is greater than 90 deg, the periodic pattern is shaped as shown in FIG. 9. In this case, the saving of area is given by the expression:

$$\text{Area saving} = 1 - (\text{Planar Equivalent Area/Total Channel Area}) = 1 - (B+D)/(A+B+2C)$$

All the previously described patterns can be realized with rounded corners in order to improve the uniformity of the current.

Other embodiments of the structure with channel regions shaped in different patterns are illustrated in FIG. 10, FIG. 11 and FIG. 12. However, in these cases the calculation of the silicon area saving is more complex.

In order to increase the carrier mobility in the device, a thin n-type layer can be formed on the top of the substrate surface as illustrated in FIG. 13. This layer can be conformed to the shape of the gate-oxide surface or not. Utilizing a p-doped poly-silicon gate layer, instead of the classical n-doped poly silicon layer used for an n-channel MOS, the semiconductor device has a positive threshold voltage and still behaves as an enhancement MOS transistor.

Most of the channel patterns described above can be obtained with a simple extra process step. By means of a simple silicon etching step at the beginning of the MOS process, the substrate surface can be shaped as desired. The other process steps (implantations, gate oxide thermal growth, and gate deposition) will remain unchanged with respect to a conventional CMOS process technology. This makes the present invention very cost attractive.

The present invention can be realized in Semiconductor On Insulator (SOI) technology, in CMOS bulk technology or in High Electron Mobility Transistor (HEMT) technology.

In the case of the utilization of the present invention for power transistor structures particular attention has to be paid to thermal considerations. It is important to avoid any hot spots or thermal positive feedbacks. Typically the thermal flow in a power transistor utilized in integrated circuits is occurring from the channel area to the substrate (when a package is used) or to the connecting terminals at the surface (bumps) for CSP (chip scale package).

The fact that the present invention offers lower specific $R_{DSon}$ can be viewed as a means of producing more efficient power devices and therefore having less power to be dissipated for the same silicon area. But it could also be interpreted as a means to reduce the silicon area for the same on resistance. In that case the current density is increased and the need to dissipate more power in lower silicon area could present some technical challenges.

Similarly the higher current density in the device may pose problems with the electro-migration limitations of the metal connections involved. The general advantage of lower channel resistance of the present invention puts more emphasis on using thick metals for power interconnections and metals like copper in order not to transfer the general resistivity problem to the main transistors terminals connections.

The shape of the channel is extremely critical in order to obtain a high performance device which can be manufactured with a simple process flow, making the proposed solution of practical use in modern integrated circuits. Indeed, even if the channel can be shaped also with a sinusoidal pattern as illustrated in FIG. 10, the presence of flat surfaces as shown in FIG. 8 allows for the manufacturing of the device by adding only one extra silicon etch step with respect to the manufacturing process flow used for conventional planar FET.

Another extremely important difference between the embodiment of FIG. 8 and the one of FIG. 10 is the mobility of the carriers (electrons or holes) moving into the channel at the interface between the gate dielectric and the semiconductor channel region. Indeed, the carrier mobility is highly dependent from the crystallographic orientation of the dielectric/semiconductor interface. For example, the electron mobility is maximized on the (100) plane of a silicon wafer and greatly decreases in the other crystallographic planes (reduction that can also be greater than 50%).

The formation of flat channel surfaces as shown in FIG. 8 allows to maintain the maximum electron mobility in all the horizontal flat surfaces of the channel, so as to actually improve the performance of the device with respect to a conventional MOS device.

In the embodiment of FIG. 10 instead, since the presence of lower and upper rounded valleys the electronic transport is operated on multiple planes both on the upper and lower valleys (comprising also the low mobility (110) plane), which greatly lower the device performance with respect to state of the art MOS devices.

Furthermore, the formation of a device as shown in FIG. 8 allows for the clear identification of the crystallographic plane where the carriers are moving into, and therefore allows for the optimization of the transport plane also for the vertical walls of the channel. For example by rotating the device layout of 45 degrees, it is possible to maintain the 100 orientation of the channel also along the perpendicular surfaces, greatly improving the device performance. Obviously, this operation is useless if the device channel does not present a clear crystallographic orientation as it happens in the device of FIG. 10, where the rounded valleys do not allow for the determination of a clear crystallographic plane.

The present invention can be realized in Semiconductor On Insulator (SOI) technology, in CMOS bulk technology or in High Electron Mobility Transistor (HEMT) technology.

It is clearly more advantageous from a specific resistance standpoint to have deep trenches of the periodic patterns so as to make the channel region less planar as possible and increase the current density per silicon area.

It is therefore an object of the invention to increase the packing density and to reduce the device wiring capacitance by compressing the device dimensions.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 6

Figure 1:
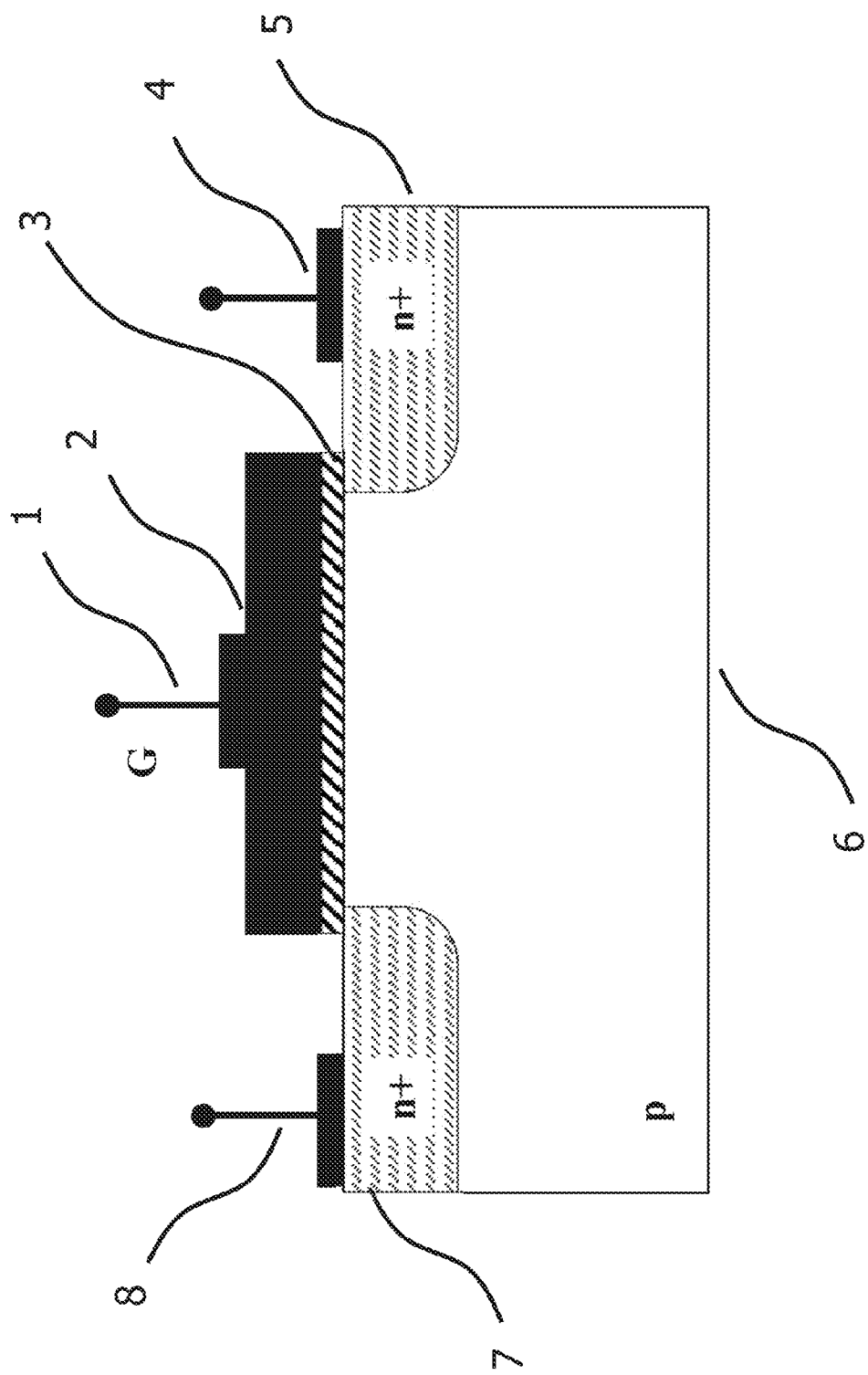
FIG. 1 shows a cross section view of a conventional MOSFET (prior art).
Figure 2:
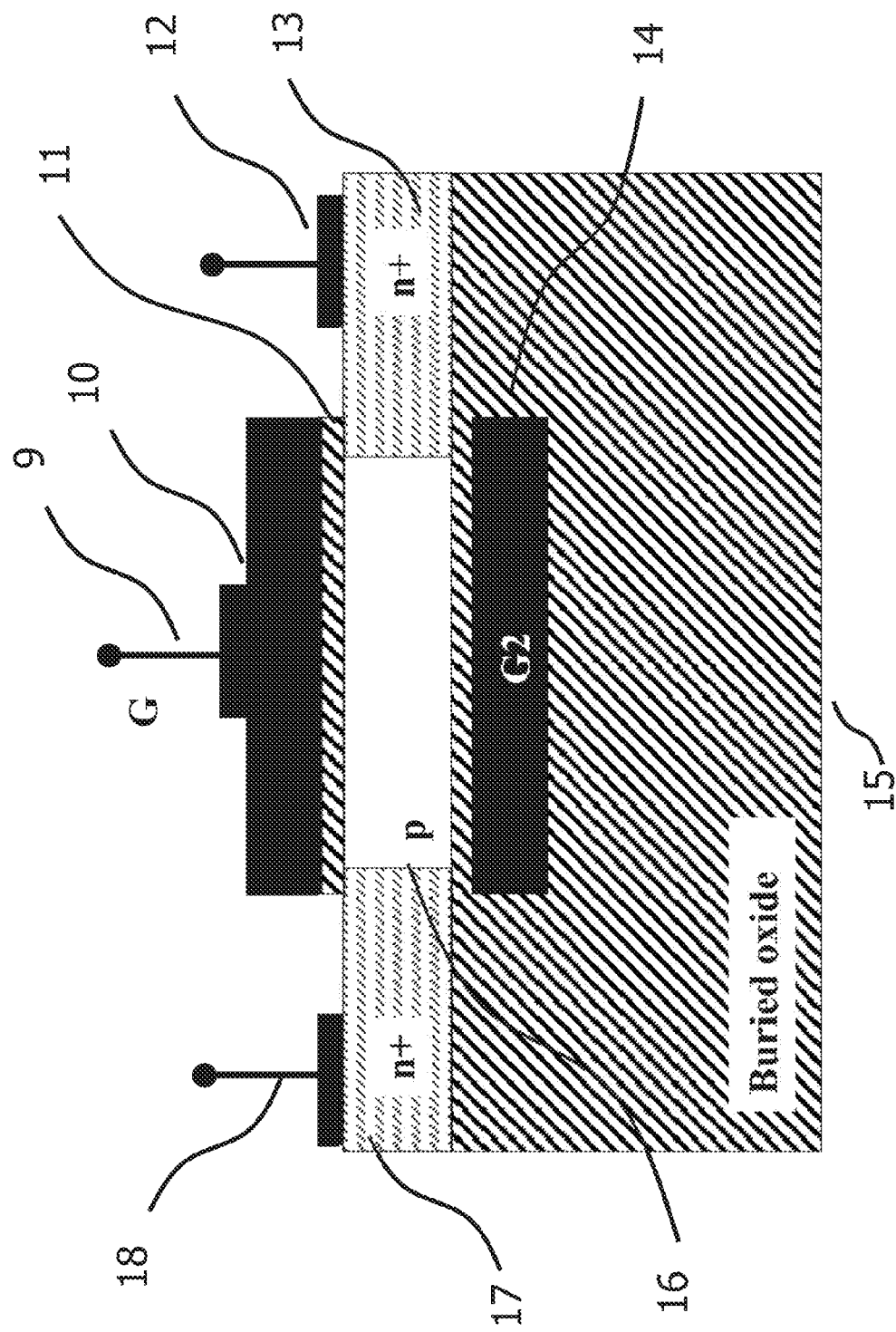
FIG. 2 shows a cross section view of a double gate MOS (prior art).
Figure 3:
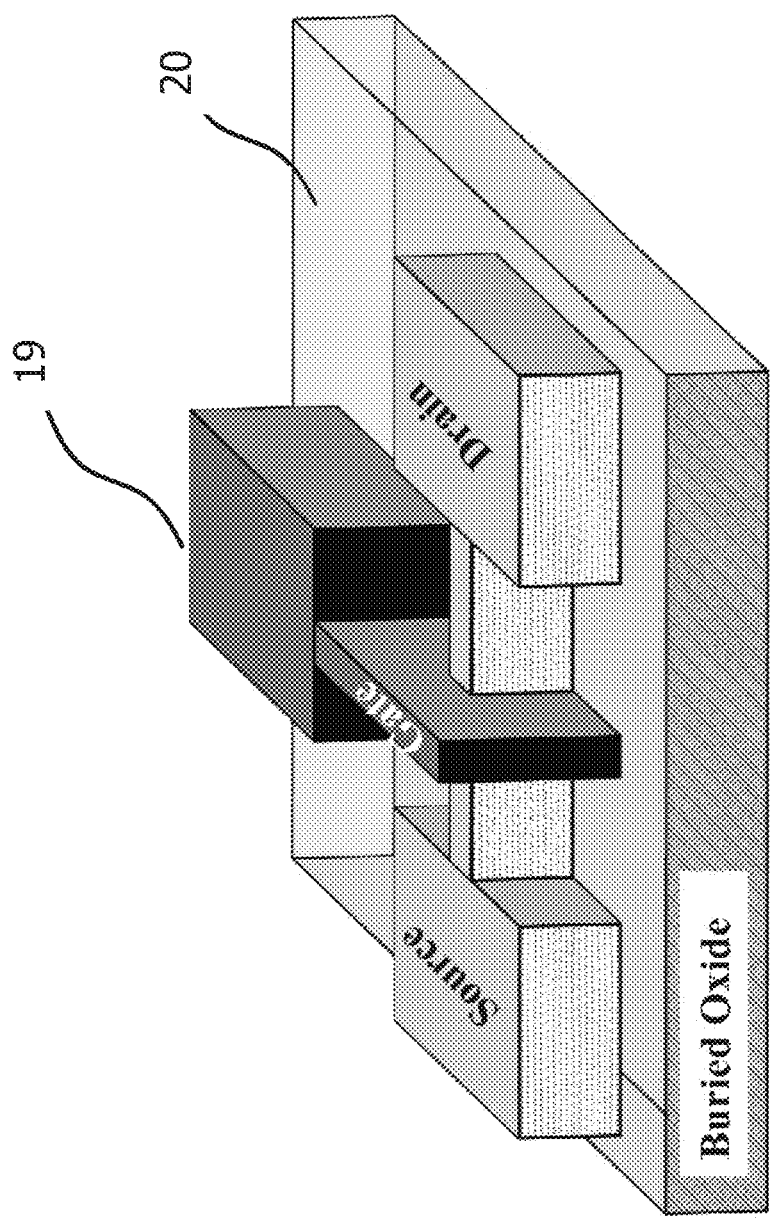
FIG. 3 shows a Triple gate MOS (prior art).
Figure 4:
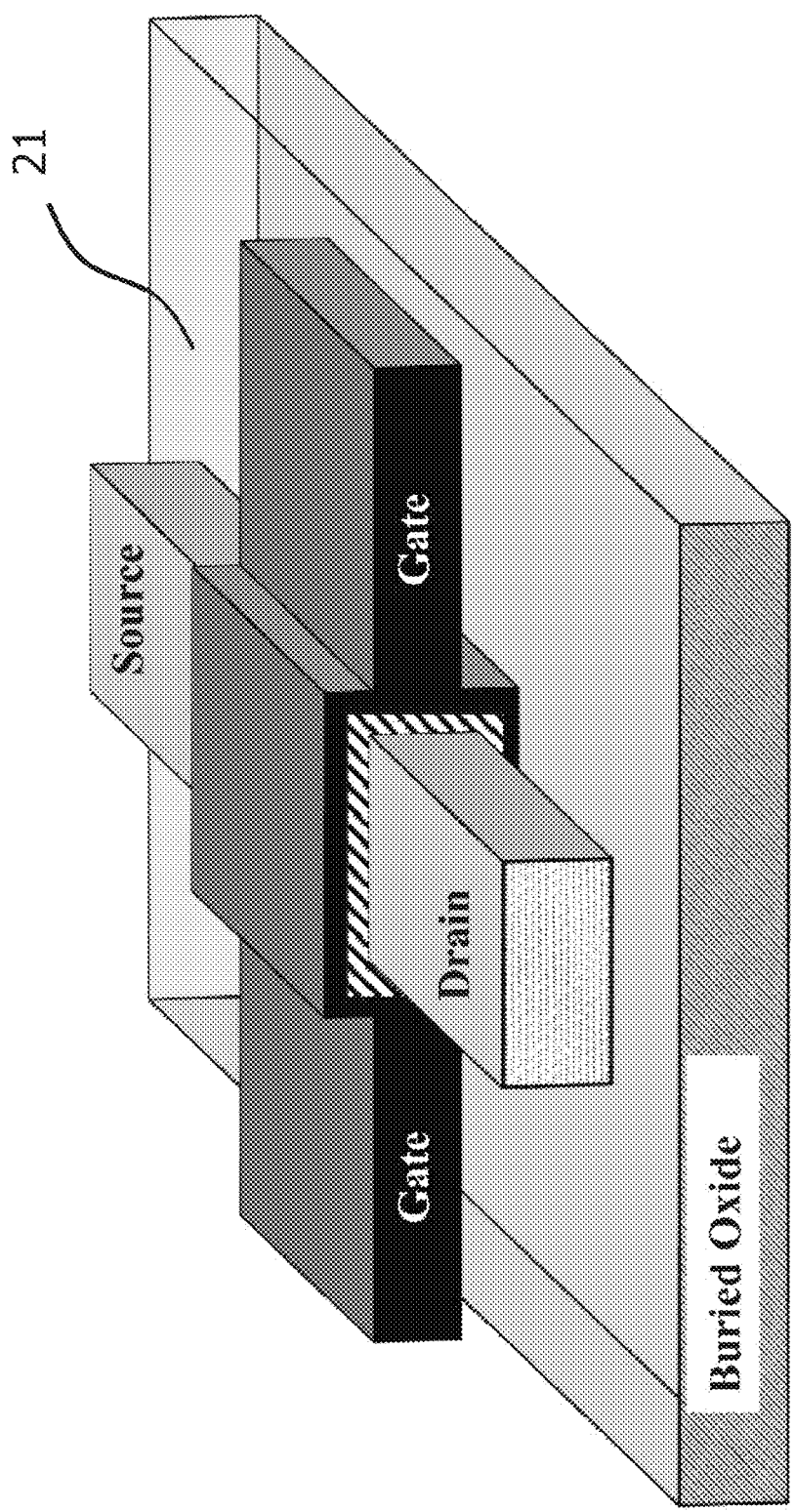
FIG. 4 shows a Gate all around MOS (prior art).
Figure 5:
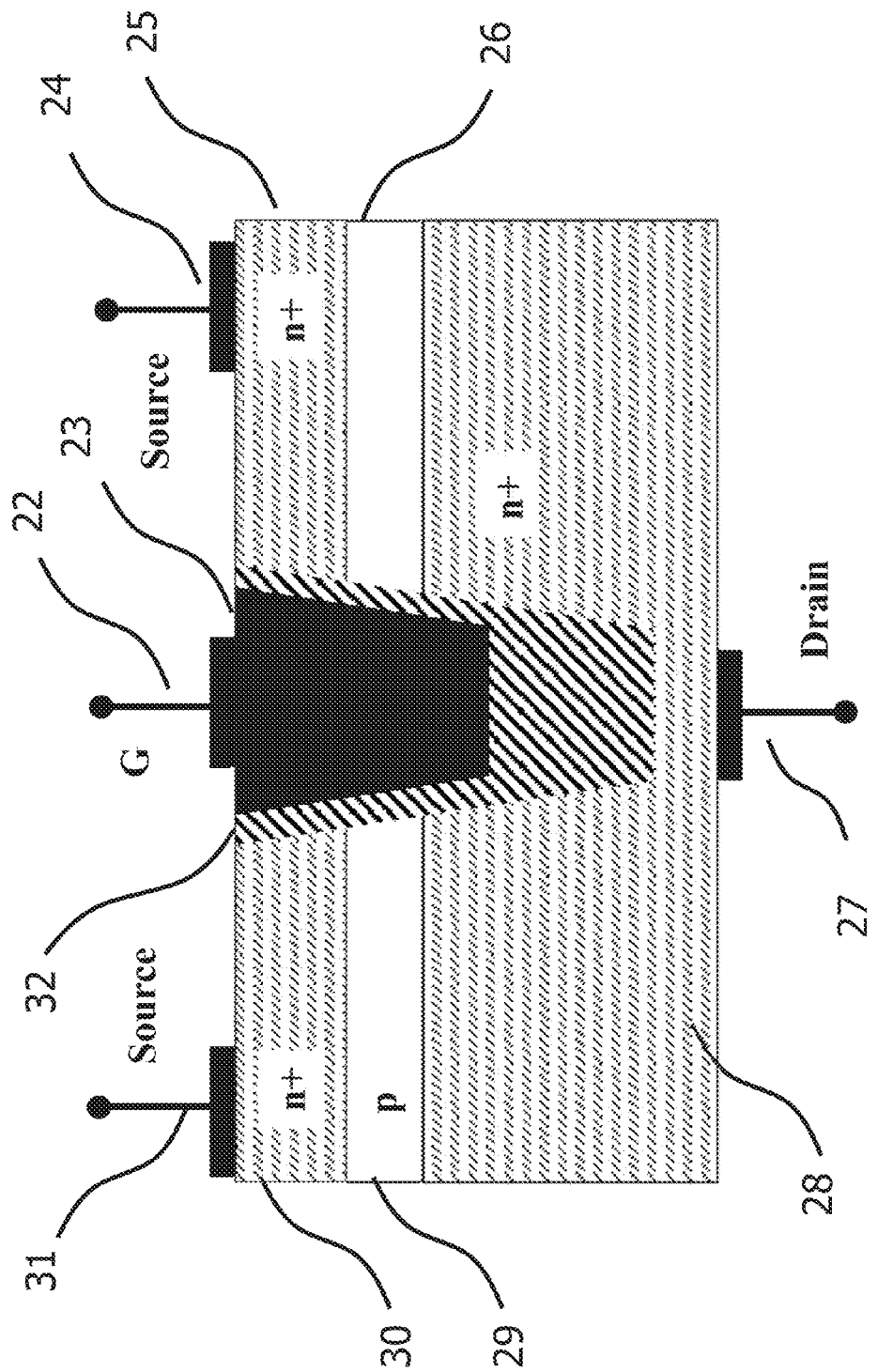
FIG. 5 shows a cross section view of a V power MOS (prior art).
Figure 6:
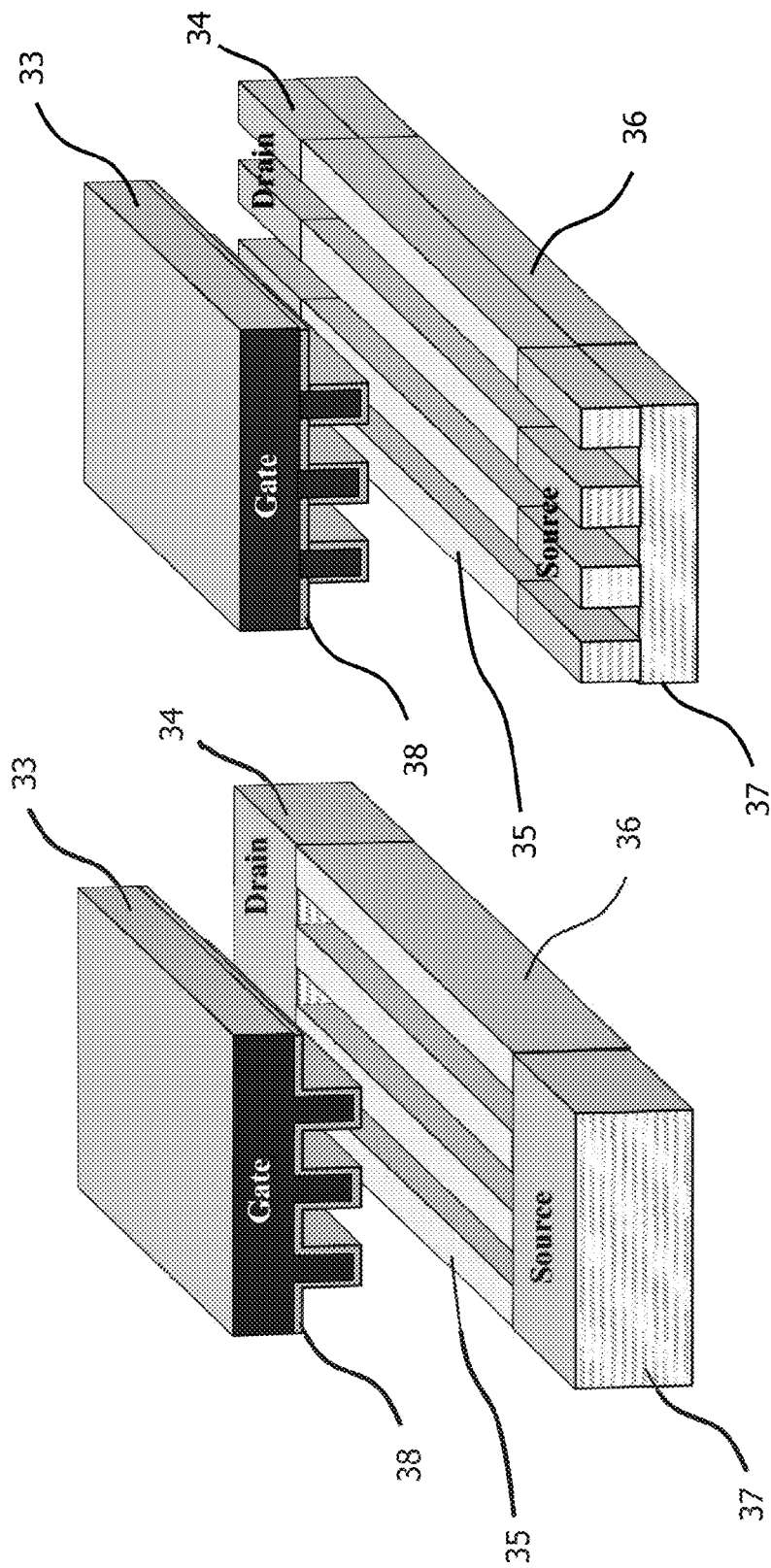
FIG. 6 shows the first embodiment of the invention.

FIG. 6 is showing the first general embodiment of the invention with the gate and the oxide slightly separated in order to better show the channel region. The n+-type regions 34 and 37 define the drain and the source of the transistor. The region 38 corresponds to the gate-oxide, and the region 36 is the p-type substrate of the device. The gate electrode 33, which may be built in poly-silicon or metal, forms the gate of the transistor. As it can be seen, differently from a conventional MOS where the channel region is planar, the channel region of the embodiment is shaped with a periodic pattern in the direction of the channel width.

The present invention therefore defines a MOS device with a total channel area much larger than the equivalent planar area, which leads to a significant reduction of the specific on-resistance per area of the device. Furthermore, since the drain, source, and gate contacts are compressed in much less space, the parasitic resistances and capacitances associated with these contacts are significantly reduced.

All the channel patterns described above can be obtained with a simple extra process step. By means of a simple silicon etching step at the beginning of the MOS process, the substrate surface can be shaped as desired. The other process steps (implantations, gate oxide thermal growth, and gate deposition) will remain unchanged with respect to a conventional CMOS process technology. This makes the present invention very cost attractive.

The present invention can be realized in Semiconductor On Insulator (SOI) technology, in CMOS bulk technology or in High Electron Mobility Transistor (HEMT) technology.

In the case the present invention is used for power transistor structures, particular attention must be paid to thermal considerations. It is important to avoid any hot spots or thermal positive feedbacks. Typically the thermal flow in a power transistor utilized in integrated circuits is occurring from the channel area to the substrate (when a package is used) or to the connecting terminals at the surface (bumps) for CSP (chip scale package).

The fact that the present invention offers lower specific $R_{DSon}$ can be viewed as a means of producing more efficient power devices and therefore having less power to be dissipated for the same silicon area. But it could also be interpreted as a means to reduce the silicon area for the same on resistance. In that case the current density is increased and the need to dissipate more power in lower silicon area could offer some technical challenges.

Similarly the higher current density in the device may pose issues with the electro-migration limitations of the metal connections involved. The general advantage of lower channel resistance of the present invention puts more emphasis on using thick metals for power interconnections and metals like copper in order not to transfer the general resistivity problem to the main transistors terminals connections.

It is clearly more advantageous from a specific resistance standpoint to have deep trenches of the periodic patterns so as to make the channel region less planar as possible and increase the current density per silicon area. However, excessively increasing the slop and/or the length of the non-horizontal edges of the channel pattern can cause problems with the doping uniformity along the channel, leading to a non uniform distribution of the current during the normal operation of the device. A good trade off must be therefore found in order to maximize the advantages of the present invention for a given process technology.

B FIG. 7

Figure 7:
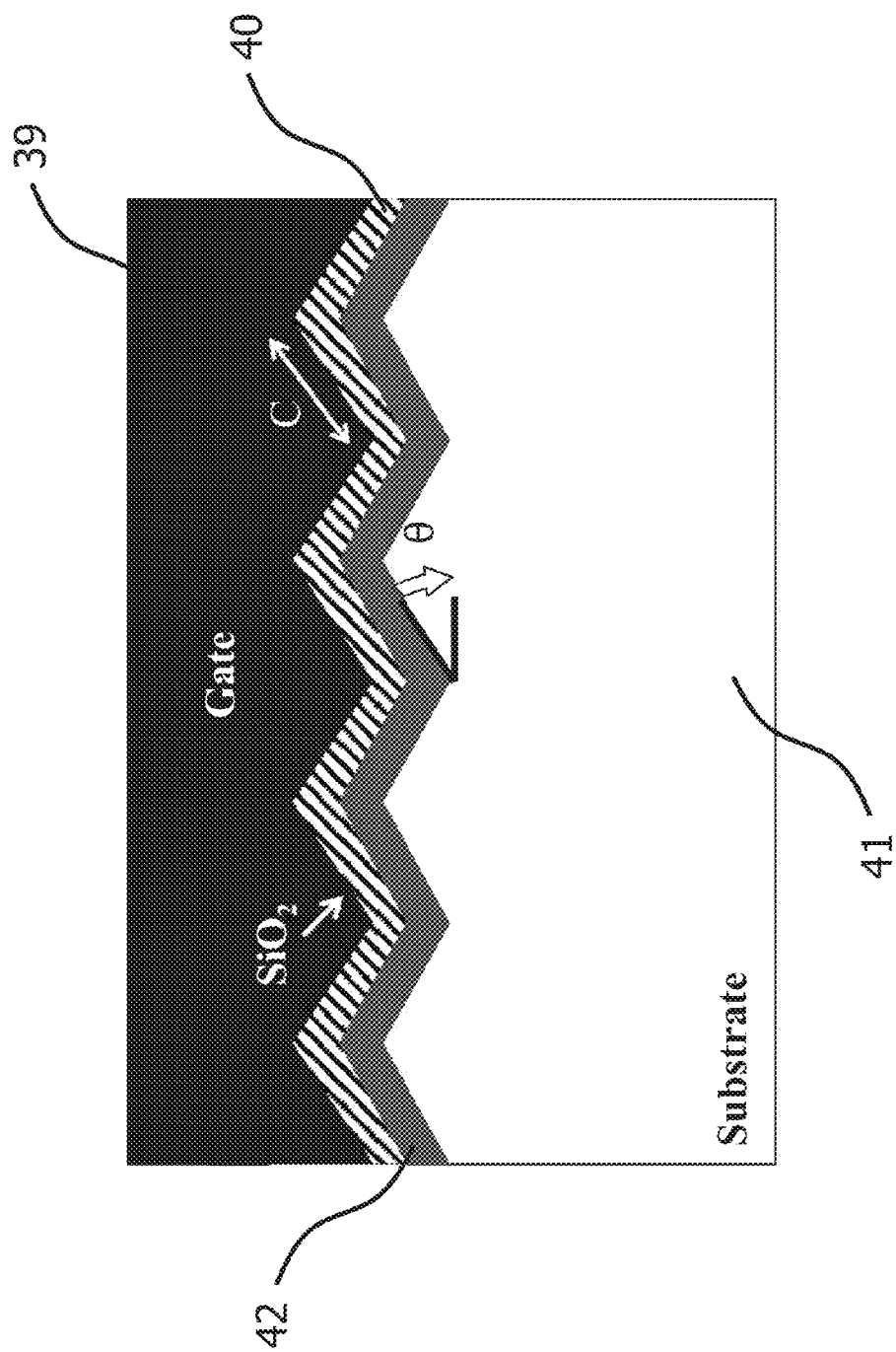
FIG. 7 shows a cross section view of a second embodiment of the invention.

The drawing of FIG. 7 shows a cross section view of another embodiment of the invention. The region 40 corresponds to the gate-oxide and the region 41 is the p-type substrate of the device. The gate electrode 39 forms the gate of the transistor. Region 42 is the region where the electron channel forms when a positive voltage is applied to the gate. In this embodiment, the channel region has a repetitive triangular pattern.

The ratio of the planar area with respect to the more vertical section of the channel defines the improvement in terms of density with respect to a conventional planar transistor. The greater the angle θ shown in FIG. 7, the lower is the $R_{DSon}$*area of the device. It is therefore advantageous to maximize as much as possible the angle. On the other hand steep angles may pose other challenges like higher cost for deeper trenches, planarization of the metallization of interconnection, and thermal dissipation.

C FIG. 8

Figure 8:
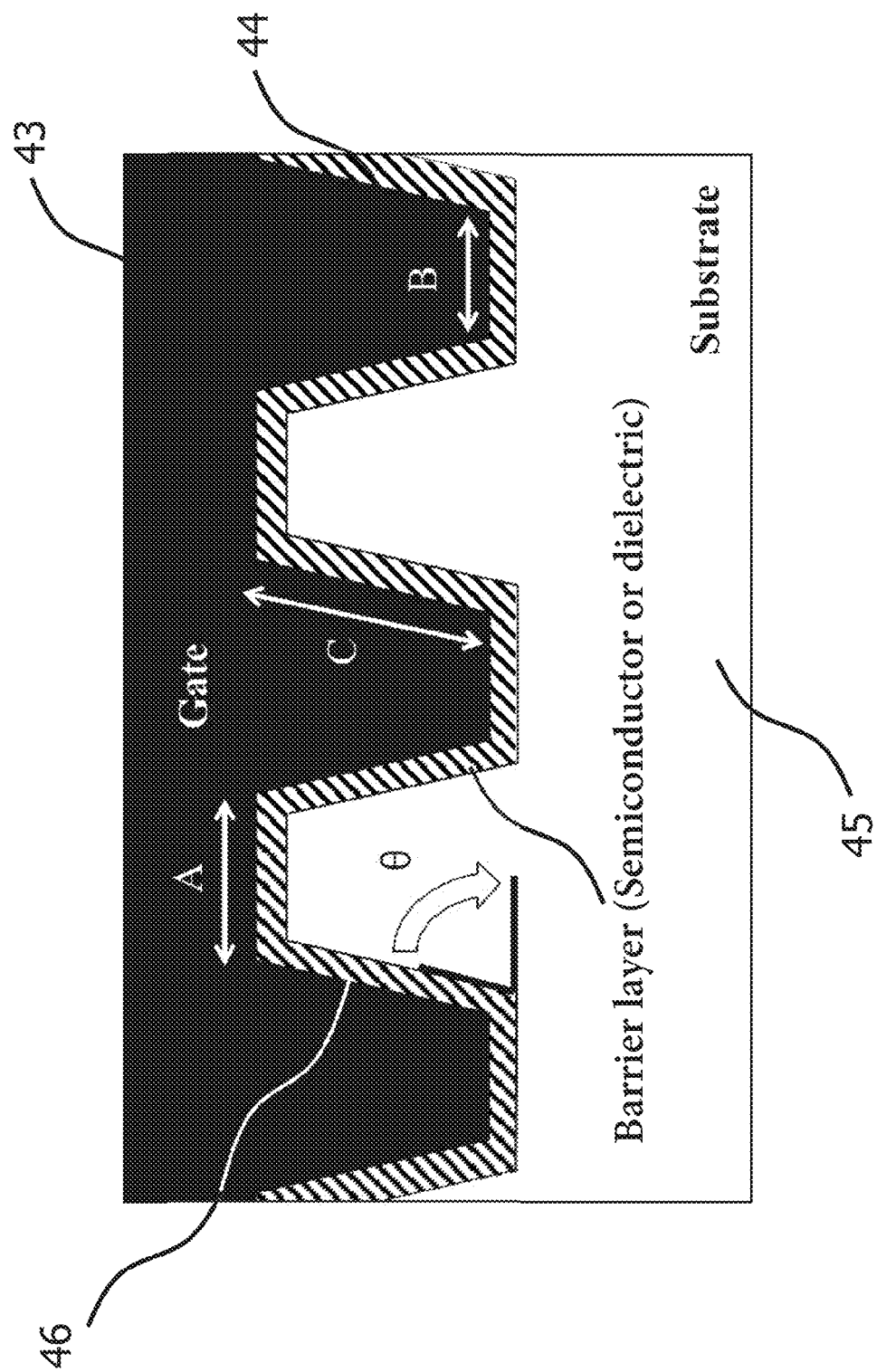
FIG. 8 shows a cross section view of a third embodiment of the invention.

FIG. 8 is depicting the cross-section view of a third embodiment of the invention. This structure is similar to the one shown in FIG. 7, with the exception that the channel region has a trapezoidal shaped pattern. If A=B=0, the trapezoidal pattern of FIG. 8 is reduced to the triangular one of FIG. 7. If instead θ=90 deg, we obtain a rectangular pattern.

D FIG. 9

Figure 9:
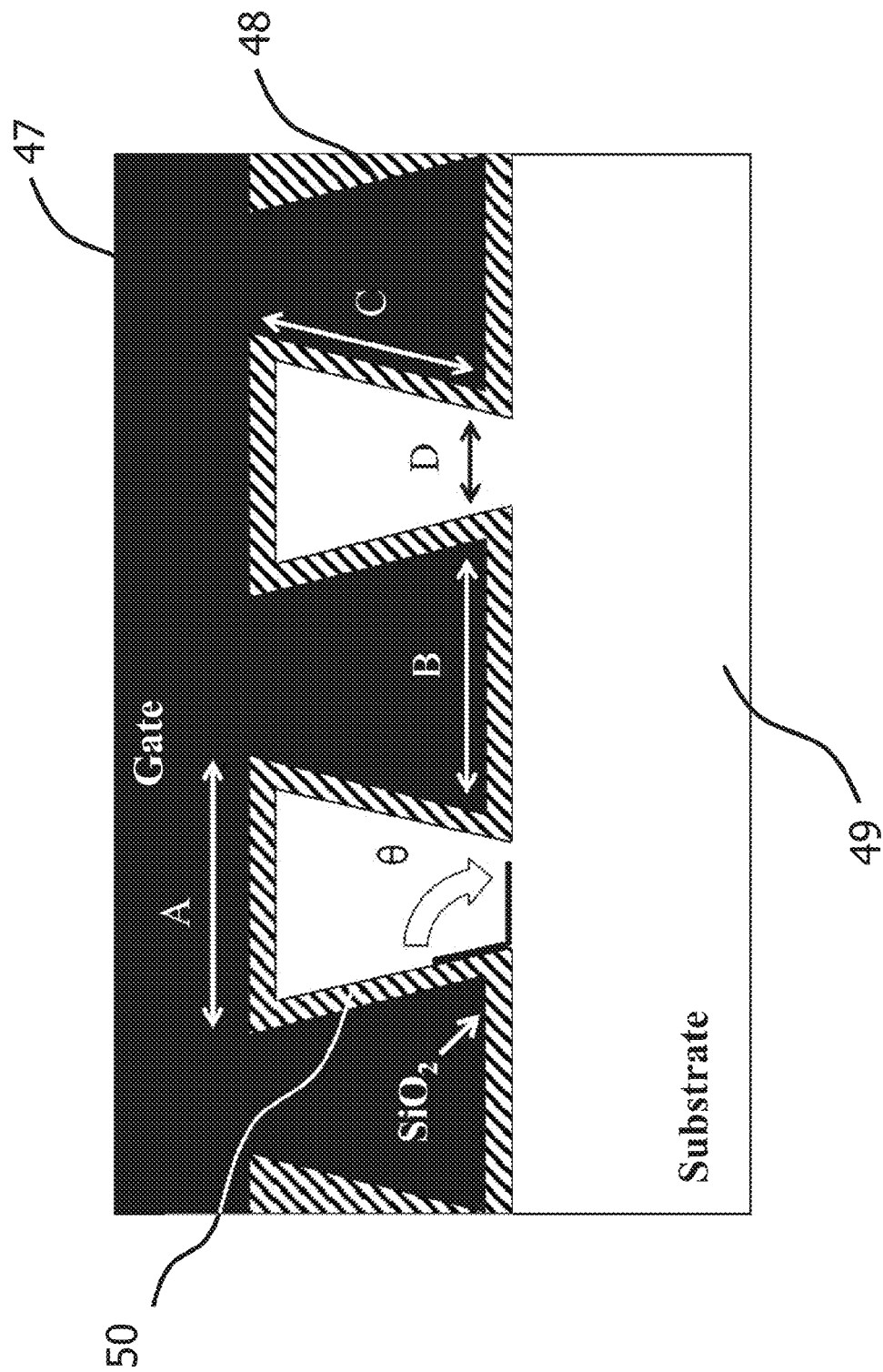
FIG. 9 shows a cross section view of a fourth embodiment of the invention.

FIG. 9 is depicting the cross-section view of a fourth embodiment of the invention. This structure is similar to the one depicted in FIG. 8, with the exception that the θ angle is greater than 90 deg. In this case, both the lateral channel regions and the upper base A of the trapezoidal patterns provide a large advantage in terms of overall silicon area savings.

E FIG. 10

Figure 10:
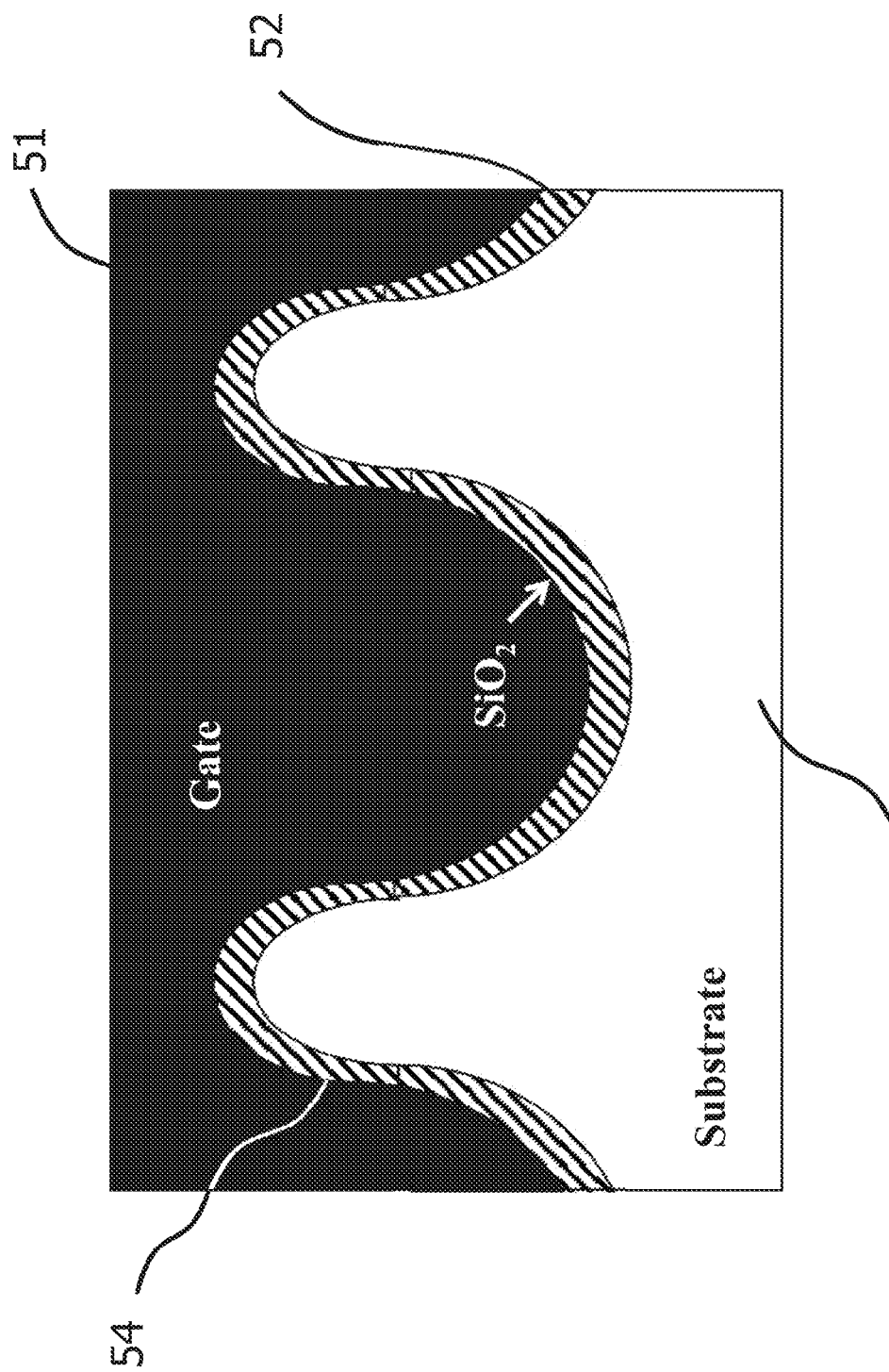
FIG. 10 shows a cross section view of a fifth embodiment of the invention.

FIG. 10 is depicting the cross-section view of a fifth embodiment of the invention. This structure is similar to the one shown in FIG. 8, with the exception that the channel region has a general shaped pattern that although not necessarily sinusoidal resembles the sinusoidal one.

F FIG. 11

Figure 11:
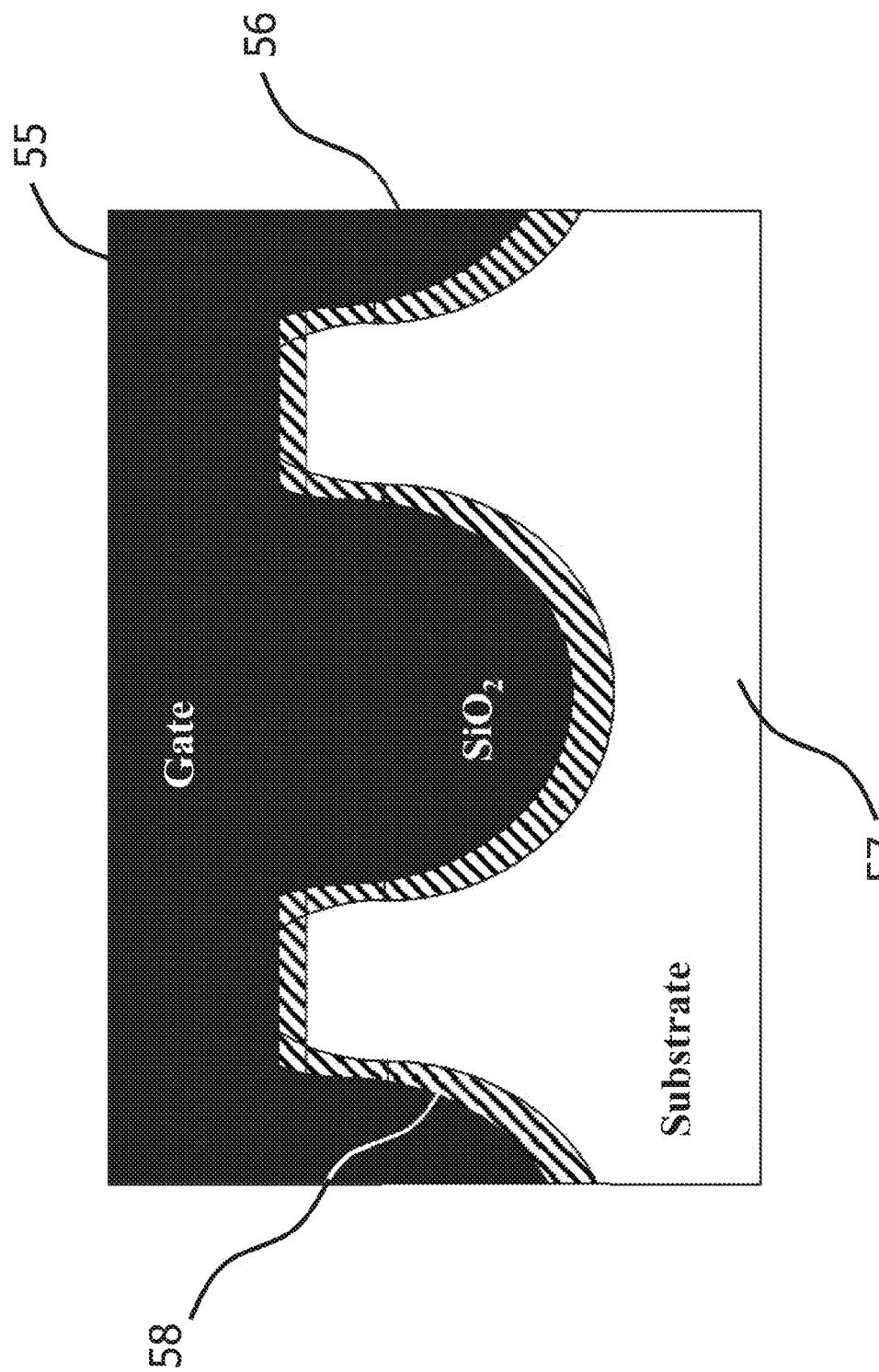
FIG. 11 shows a cross section view of a sixth embodiment of the invention.

FIG. 11 is depicting the cross-section view of another embodiment of the invention. This structure is similar to the one illustrated in FIG. 10, with the exception that the channel region has been obtained by forming periodic trenches along the channel width direction. Most of the considerations mentioned for the previous embodiments are valid in this case as well.

G FIG. 12

Figure 12:
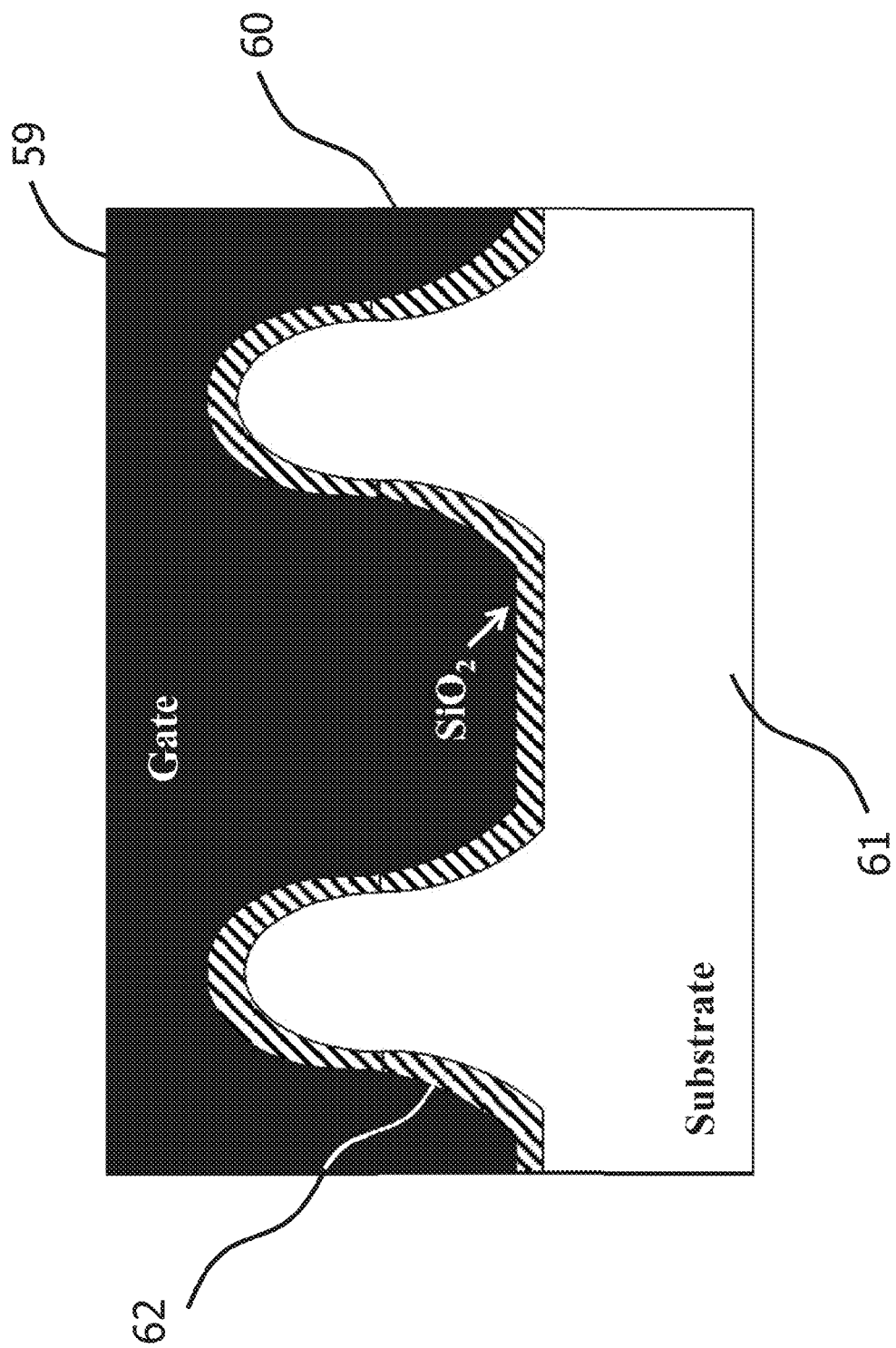
FIG. 12 shows a cross section view of a seventh embodiment of the invention.

FIG. 12 is depicting the cross-section view of a seventh embodiment of the invention. This structure is similar to the one shown in FIG. 10, the main difference being that a portion of the channel region is flat.

H FIG. 13

Figure 13:
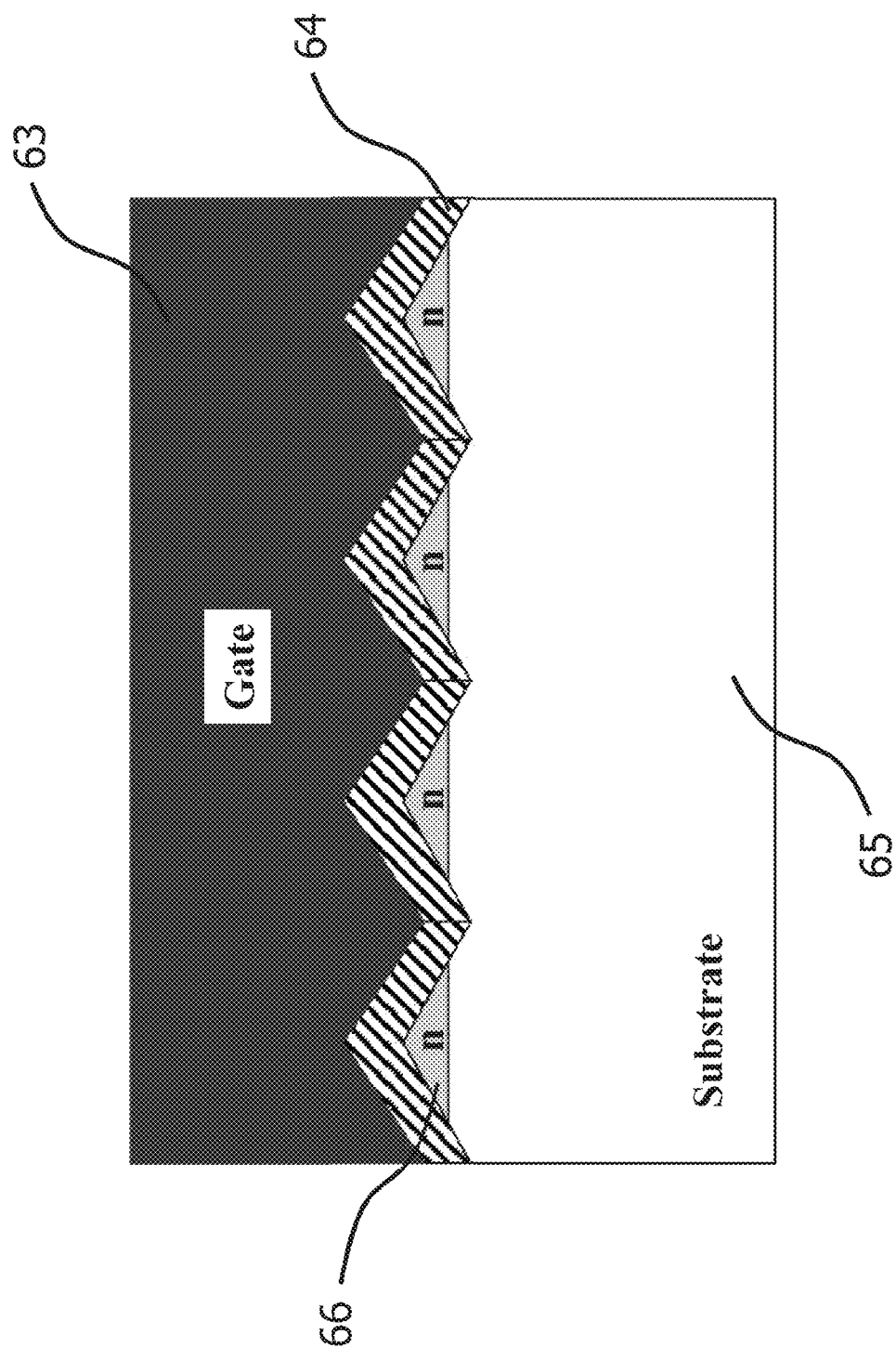
FIG. 13 shows a cross section view of an eighth embodiment of the invention.

FIG. 13 is depicting the cross-section view of another embodiment of the invention. This structure is similar to the one described for FIG. 7, with the exception that a thin n-type layer 66 has been formed on the tip of the triangular pattern and the poly-silicon gate 63 has been p-doped. This configuration allows the increase of the mobility of the electrons in the device, and at the same time it maintains an enhancement mode type of operation.

I FIG. 14

Figure 14:
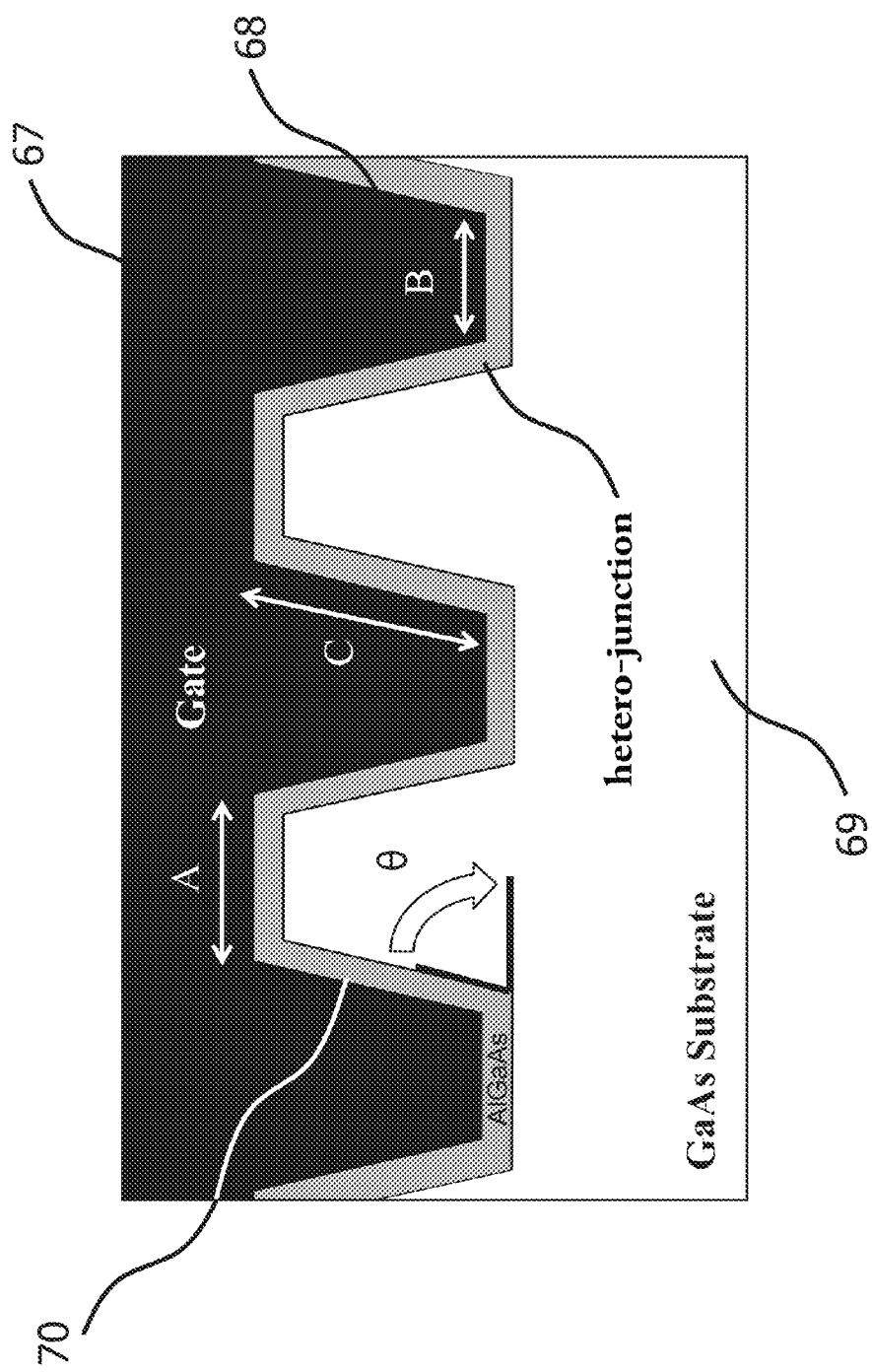
FIG. 14 shows an example of implementation of the third embodiment of the invention implemented in III-V technology.

FIG. 14 is depicting the cross-section view of another embodiment of the present invention implemented in III-V technology.

J FIG. 15

Figure 15:
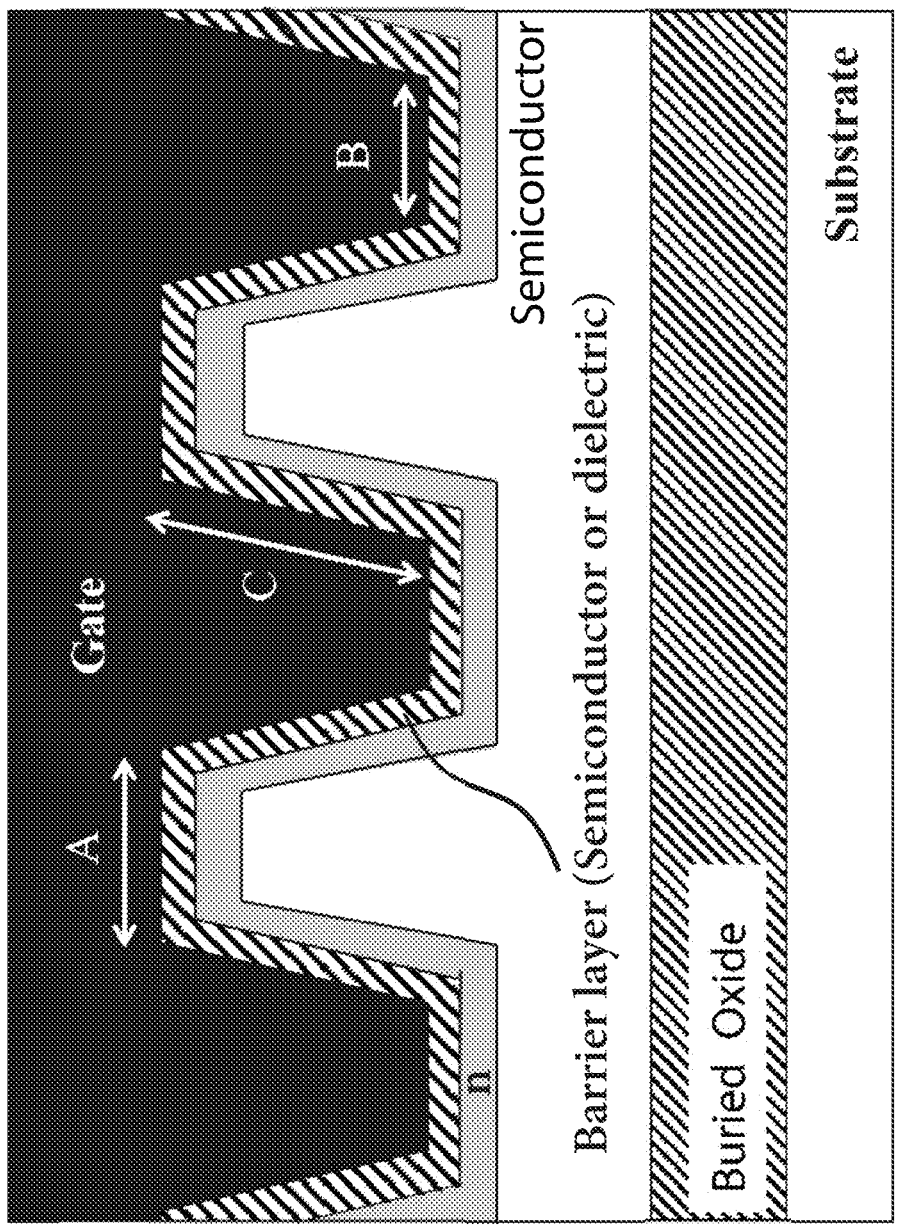
FIG. 15 shows an example of implementation of the current invention in Semiconductor On Insulator technology.

FIG. 15 is depicting an example of implementation of the current invention in Semiconductor On Insulator technology. In this embodiment, aside adding a buried insulating layer, a thin n-type layer has been also formed on the upper portion of the channel layer and the poly-silicon gate has been p-doped.

K FIG. 16

Figure 16:
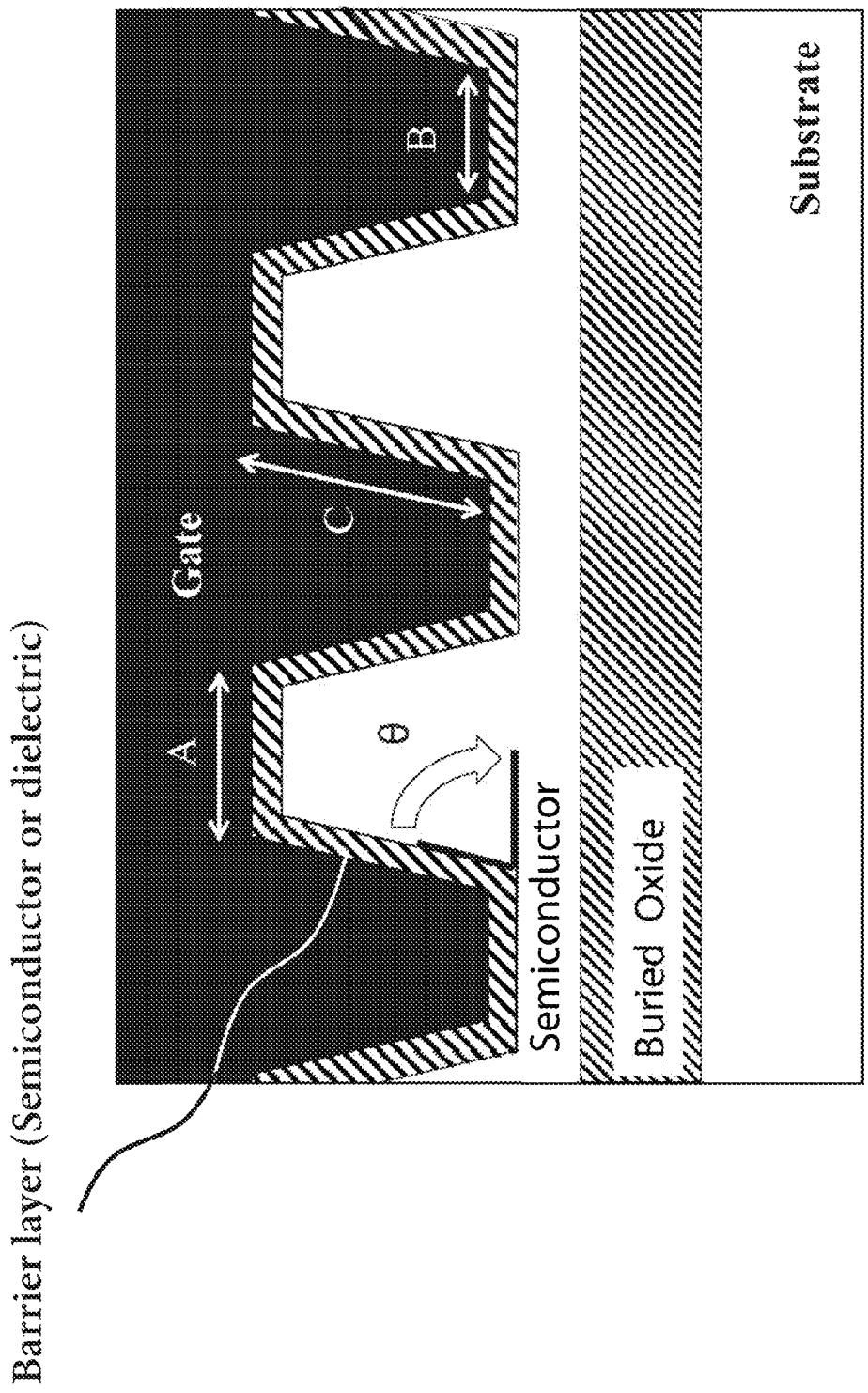
FIG. 16 shows a further example of implementation of the current invention in Semiconductor On Insulator technology.

FIG. 16 is depicting an example of implementation of the embodiment of FIG. 8 in Semiconductor On Insulator technology. If desired, also the upper surface of the buried oxide layer can be shaped with a periodic pattern as the upper surface of the active semiconductor layer.

L FIG. 17

Figure 17:
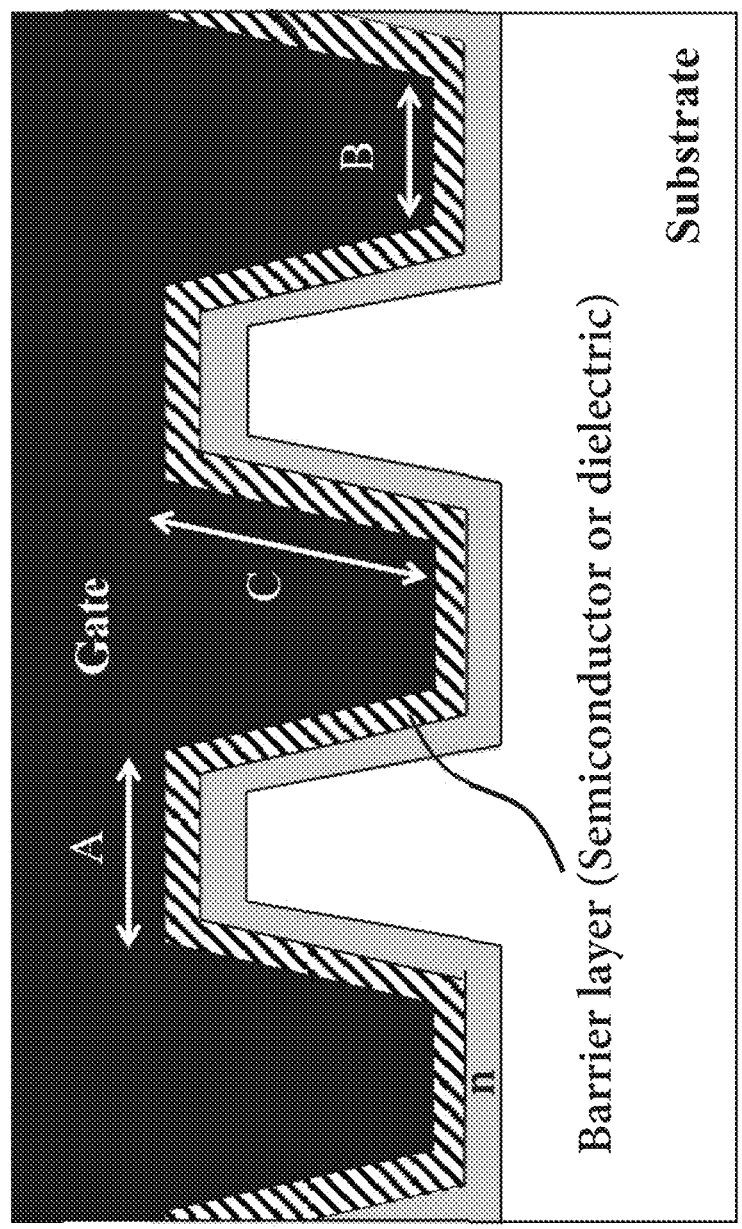
FIG. 17 shows a cross section view of a further embodiment of the invention.

FIG. 17 is depicting the cross-section view of another embodiment of the present invention. This structure is similar to the one shown in FIG. 8, with the exception that a thin n-type layer has been formed on the upper portion of the channel layer and the poly-silicon gate has been p-doped.

For all the FET structures described above, also the equivalent p-channel version can be obtained by simply substituting the n-doped regions with p-type regions and vice versa.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. An area efficient semiconductor field effect device comprising:
   a semiconductor layer;
   a body region of a first conductivity type formed in said semiconductor layer;
   a source region and a drain region of a second conductivity type formed in said body region;
   a channel region between said source region and said drain region;
   a barrier layer extending over at least a portion of said channel region;
   a gate region extending over at least a portion of said barrier layer;
      wherein said barrier layer is directly in contact with said channel region;
      wherein said barrier layer is directly in contact with at least one of said source and drain regions;
      wherein said gate region is directly in contact with said barrier layer;
      wherein said source and drain regions are formed in an upper portion of said semiconductor layer;
      wherein at least a portion of said channel region is shaped in a periodic pattern in a direction orthogonal to the current flow present in said field effect device when said field effect device is turned on;
      wherein at least a portion of a period of said periodic pattern of said channel region comprises a substantially flat bottom-most surface;
      wherein said portion comprising the substantially flat bottom-most surface is extending continuously from said source region to said drain region at a depth below the upper surface of said source and drain regions;
      whereby said shaping of said portion resembling a flat surface guarantees high carrier mobility in said channel region;
      wherein said source and drain regions are shaped with said periodic pattern, and
      wherein said channel region is comprising a semiconductor region of said second conductivity type extending from said source region to said drain region, and said gate region is a semiconductor region of said first conductivity type.

2. The semiconductor field effect device of claim 1 comprising an insulating layer under said semiconductor layer.

3. The semiconductor field effect device of claim 1 wherein said field effect device is a metal-oxide-semiconductor transistor, and said barrier layer is a dielectric layer.

4. An area efficient semiconductor field effect device comprising:
   a semiconductor layer;
   a source region and a drain region;
   a channel region between said source region and said drain region;
   a barrier layer extending over at least a portion of said channel region;
   a gate region extending over at least a portion of said barrier layer;
      wherein said barrier layer is directly in contact with said channel region;
      wherein said barrier layer is directly in contact with at least one of said source and drain regions;
      wherein said source and drain regions are formed in an upper portion of said semiconductor layer;
      wherein at least a portion of said channel region is shaped in a periodic pattern in a direction orthogonal to the current flow present in said field effect device when said field effect device is turned on;
      wherein at least a portion of a period of said periodic pattern of said channel region comprises a substantially flat bottom-most surface;
      wherein said portion comprising the substantially flat bottom-most surface is extending continuously from said source region to said drain region at a depth below the upper surface of said source and drain regions;
      whereby said shaping of said portion resembling a flat surface guarantees high carrier mobility in said channel region;
      wherein said source and drain regions are shaped with said periodic pattern, and
      wherein said channel region is comprising a semiconductor region of a first conductivity type extending from said source region to said drain region, and said gate region is a semiconductor region of a second conductivity type.

5. The semiconductor field effect device of claim 4 wherein said field effect device is a high electron mobility transistor, and said barrier layer is a semiconductor barrier layer.

6. The semiconductor field effect device of claim 4 wherein said field effect device is a metal-oxide-semiconductor transistor, and said barrier layer is a dielectric layer.

7. The semiconductor field effect device of claim 4
   wherein said first conductivity type is n-type when said semiconductor field effect device is a n-channel field effect transistor, and
   wherein said first conductivity type is p-type when said semiconductor field effect device is a p-channel field effect transistor.

8. An area efficient semiconductor field effect device comprising:
   a semiconductor layer;
   a source region and a drain region;
   a channel region between said source region and said drain region;
   a barrier layer extending over at least a portion of said channel region;
   a gate region extending over at least a portion of said barrier layer;
      wherein said barrier layer is directly in contact with said channel region;
      wherein said barrier layer is directly in contact with at least one of said source and drain regions;
      wherein said source and drain regions are co-planar;
      wherein at least a portion of said channel region is shaped in a periodic pattern in a direction orthogonal to the current flow present in said field effect device when said field effect device is turned on;
      wherein at least a portion of a period of said periodic pattern of said channel region comprises a substantially flat bottom-most surface;
      wherein said portion comprising the substantially flat bottom-most surface is extending continuously from said source region to said drain region at a depth below the upper surface of said source and drain regions;
      whereby said shaping of said portion resembling a flat surface guarantees high carrier mobility in said channel region;

wherein said source and drain regions are shaped with said periodic pattern, and wherein said channel region is comprising a semiconductor region of a first conductivity type extending from said source region to said drain region, and said gate region is a semiconductor region of a second conductivity type.

9. The semiconductor field effect device of claim 8 further comprising a dielectric layer under said semiconductor layer.

10. The semiconductor field effect device of claim 8 further comprising at least one semiconductor hetero-junction formed with semiconductor compound materials comprising elements of the III and V groups of the periodic table.

11. The semiconductor field effect device of claim 8 wherein at least one period of said periodic pattern of said channel region is formed in at least one of the geometric shapes belonging to the group comprising the triangular, the trapezoidal, and the square shape.

12. The semiconductor field effect device of claim 8 wherein the non-planar portion contribution to said channel region of said field effect device is larger than a planar portion of said channel region.

13. The semiconductor field effect device of claim 8 wherein said field effect device is a high electron mobility transistor, and said barrier layer is a semiconductor barrier layer.

14. The semiconductor field effect device of claim 8 wherein said field effect device is a metal-oxide-semiconductor transistor, and said barrier layer is a dielectric layer.

15. The semiconductor field effect device of claim 8
wherein said first conductivity type is n-type when said semiconductor field effect device is a n-channel field effect transistor, and wherein said first conductivity type is p-type when said semiconductor field effect device is a p-channel field effect transistor.

* * * * *